US006990725B2

(12) United States Patent
Fontanella et al.

(10) Patent No.: US 6,990,725 B2
(45) Date of Patent: Jan. 31, 2006

(54) FABRICATION APPROACHES FOR THE FORMATION OF PLANAR INDUCTORS AND TRANSFORMERS

(76) Inventors: Mark D. Fontanella, 111 Manor Ave., Wellesley, MA (US) 02482; Paul Greiff, 2 Cameron Rd., Wayland, MA (US) 01778; Donato Cardarelli, 16 Ledgetree Rd., Medfield, MA (US) 02052; Joseph G. Walsh, 1753 Beacon St., #1, Brookline, MA (US) 02445

( * ) Notice: Subject to any disclaimer, the term of this patent is extended or adjusted under 35 U.S.C. 154(b) by 206 days.

(21) Appl. No.: 10/265,170

(22) Filed: Oct. 4, 2002

(65) Prior Publication Data

US 2003/0080845 A1    May 1, 2003

Related U.S. Application Data

(60) Provisional application No. 60/327,486, filed on Oct. 5, 2001.

(51) Int. Cl.
   *H01F 7/06*    (2006.01)
(52) U.S. Cl. ........................ 29/602.1; 29/604; 29/605; 29/606; 29/829; 156/89.11; 156/89.12; 156/250; 257/531; 336/176; 336/200; 336/229; 438/238; 438/381; 438/788; 438/792
(58) Field of Classification Search ............... 29/602.1, 29/604, 605, 606, 829; 336/176, 200, 229; 156/89.11, 89.12, 250, 89.1; 257/531; 438/238, 438/381, 788, 792
See application file for complete search history.

(56) References Cited

U.S. PATENT DOCUMENTS

| 5,062,197 | A | * | 11/1991 | Ngo et al. ................... 29/606 |
| 5,479,695 | A | * | 1/1996 | Grader et al. .............. 29/602.1 |
| 5,787,071 | A | * | 7/1998 | Basso et al. ................ 370/231 |
| 6,233,834 | B1 | * | 5/2001 | Walsh ........................ 33/1 PT |

FOREIGN PATENT DOCUMENTS

JP        01110714 A    *    4/1989

OTHER PUBLICATIONS

An evaluation of suitability of electromagnetic integration in single switch single stage unity power factor correction converters Gerber, M.B.; Hofsajer, I.W.; AFRICON, 1999 IEEE, vol.: 2, Sep. 28-Oct. 1, 1999; pp.: 605-610.*

* cited by examiner

*Primary Examiner*—A. Dexter Tugbang
*Assistant Examiner*—Paul D. Kim
(74) *Attorney, Agent, or Firm*—Brian M. Dingman

(57) ABSTRACT

This invention relates to the fabrication of planar inductive components whereby the design in cross-section describes a conductor surrounded by magnetic material along the length of the conductor; an electrical insulator is placed between the conductor and the magnetic material. Cases also apply where more than one independent conductor is used. The planar form allows integration of inductive components with integrated circuits. These inductive components can be embedded in other materials. They can also be fabricated directly onto parts.

6 Claims, 14 Drawing Sheets

Fabrication 1a

Fabrication 1a

Fabrication 1b

Steps a - e same as Fabrication 1a

Fabrication 1c

Step a same as Fabrication 1a b

Steps c - e same as Fabrication 1a f g h i

Fabrication 2b

Steps a - d same as Fabrication 2a

Fabrication 3b

Steps a - d same as Fabrication 3a

Fabrication 4a

Fabrication 4b
Steps a - c same as Fabrication 4a

FABRICATION APPROACHES FOR THE FORMATION OF PLANAR INDUCTORS AND TRANSFORMERS

CROSS REFERENCED TO RELATED APPLICATION

This application claims priority of Provisional application Ser. No. 60/327,486, filed Oct. 5, 2001 entitled "Fabrication Approaches for the Formation of Planar Inductors and Transformers".

STATEMENT OF FEDERALLY SPONSORED RESEARCH AND DEVELOPMENT

This invention was made with Government support under contract number DTRA01-99-C-0186 awarded by BMDO. The Government has certain rights in the invention.

BACKGROUND OF THE INVENTION

Planar inductors and transformers have many advantages. Such are disclose in U.S. Pat. No. 6,233,834, the disclosure of which is incorporated herein by reference. However, approaches for fabricating these planar devices on or in chips would provide several advantages.

SUMMARY OF THE INVENTION

This invention addresses the fabrication of planar inductive components based on a linear, thin design topology that enables greater flexibility in how the components are used, structurally and electrically. The components can be formed in a variety of ways that suit the application: onto a part of a sensor, integrated with Integrated Circuits (IC) on the same chip, embedded in circuit boards or device packaging, embedded within the volume of the IC chip to be accessed through vias, formed as discrete components for conventional electronics applications.

The inductive components are linear because their inductance varies proportionately with length. Unlike wire-wound inductive coils that occupy an appreciable volume on a circuit board location, the linear devices of this invention are planar and wire-like and can be distributed over available space.

The planar topology of this invention is practical to fabricate thus enabling large-scale production and low cost.

The inductive components of this invention include inductors, transformers, differential current transformers (DCT), isolation transformers, chokes, filters, mixers, etc.

This invention features a method of fabricating an embedded planar inductive component having one or more conductive windings, a magnetic core co-linear with and surrounding all windings, and an insulator separating each winding from any other winding and from the magnetic core, the method comprising providing a substrate defining first and second surfaces; creating one or more spaced, elongated conductive pads on one surface of the substrate; overlaying the pads and at least part of the one substrate surface with a first insulating layer; overlaying the first insulator layer with a first layer of magnetic material; depositing a second insulating layer on at least part of the other surface of the substrate; creating parallel, spaced, elongated, magnetic material deposition channels through spaced portions of the second insulating layer and through the underlying substrate and first insulating layer, ending at the first layer of magnetic material, with one channel on each side of and spaced from a pad; creating another parallel channel through the second insulating layer over and extending to an underlying conductive pad; filling the magnetic material channels with the magnetic material; filling the channel extending to the conductive pad with conductive material, to form the winding, the winding having an exposed surface; creating an insulator parallel to and between the winding and the magnetic material channels; overlaying at least the exposed surface of the winding with the insulator to form a third insulating layer; and overlaying at least the third insulating layer and the magnetic material in the magnetic material channels with a second layer of magnetic material that is in contact with the magnetic material in the magnetic material channels, to form the magnetic core.

The magnetic material overlaying steps may each comprise depositing a seed conductive layer before overlaying the magnetic material, to allow electrodeposition of the magnetic material. The first and second surfaces of the substrate may each be at the bottom of wells in the substrate. The first insulating layer may fill one well, and the second insulating layer may fill the other well. The first layer of magnetic material may be larger than the first insulating layer, so that it also overlays a part of the substrate. The second layer of magnetic material may be larger than the third insulating layer, so that it also overlays a part of the substrate. The substrate may be conductive, and, before any channel is filled, the exposed substrate material may be treated to decrease its conductivity. The substrate may comprise silicon, and the treatment may comprise oxidation. The layers of magnetic material may each comprise a series of thin magnetic laminations separated by thin non-magnetic, non-conducting layers.

Also featured is a method of fabricating an embedded planar inductive component having one or more conductive windings, a magnetic core co-linear with and surrounding all windings, and an insulator separating each winding from any other winding and from the magnetic core, the method comprising providing a substrate defining first and second surfaces; creating one or more spaced, elongated conductive pads on one surface of the substrate; overlaying the pads and at least part of the one substrate surface with a first insulating layer; overlaying the first insulator layer with a first layer of magnetic material; depositing a second insulating layer on at least part of the other surface of the substrate; creating parallel, spaced, elongated first deposition channels through spaced portions of the second insulating layer and through the underlying substrate and the first insulating layer, ending at the first layer of magnetic material, with one channel on each side of and spaced from a pad; creating another parallel channel through the second insulating layer over and extending to an underlying conductive pad; filling the channel extending to the conductive pad with conductive material, to form the winding, the winding having an exposed surface; overlaying onto the exposed surface of the winding, and depositing into the deposition channels, an insulator; creating through the middle of the deposited insulator in the first deposition channels, a narrower magnetic material deposition channel extending to the first layer of magnetic material, to leave the first deposition channels lined with insulator that, along with the insulator overlaying the exposed surface of the winding, forms a third insulating layer; and conformally coating at least the second insulating layer with a second layer of magnetic material that is in contact with the first layer of magnetic material, to form the magnetic core.

The magnetic material conformal coating step may comprises depositing a seed conductive layer before conformally coating the magnetic material, to allow electrodeposition of the magnetic material.

Also featured is a method of fabricating a planar inductive component having one or more conductive windings, a magnetic core co-linear with and surrounding all windings, and an insulator separating each winding from any other winding and from the magnetic core, the method comprising providing a component support member defining a non-magnetic top surface; sequentially overlaying at least part of the top surface of the support member with a first layer of magnetic material, a first layer of insulating material, and a layer of conductive material; removing portions of the conductive material layer down to the underlying insulating material to leave the inductive component winding; overlaying the exposed first layer of insulating material and the winding with a second layer of insulating material; creating spaced, elongated, parallel deposition channels through both layers of insulating material to the underlying first layer of magnetic material, the deposition channels on opposite sides of and spaced from the winding; and overlaying the exposed insulating material and the exposed first layer of magnetic material with magnetic material, to complete the magnetic core.

Also featured is a method of fabricating a planar inductive component having one or more conductive windings, a magnetic core co-linear with and surrounding all windings, and an insulator separating each winding from any other winding and from the magnetic core, the method comprising: providing a first layer of magnetic material covered by a first layer of insulating material, covered by a conductor layer, covered by a second layer of insulating material, covered by a second layer of magnetic material; creating parallel, spaced elongated first deposition channels through the second layers of magnetic material and insulating material, the conductor layer and the first layer of insulating material, ending at the lower magnetic layer; depositing into the first channels an insulating material; creating through the middle of the deposited insulating material in the first channels, narrower magnetic material deposition channels extending through the entire deposited insulating material thickness to the lower layer of magnetic material, to leave the first channels lined with insulating material, and expose the lower layer of magnetic material; and overlaying the magnetic material deposition channels and the exposed lower layer of magnetic material with magnetic material, to complete the magnetic core.

Still further, this invention features a method of fabricating a planar inductive component having one or more conductive windings, a magnetic core co-linear with and surrounding all windings, and an insulator separating each winding from any other winding and from the magnetic core, the method comprising providing a substrate covered by an upper magnetic material layer, covered by the winding encapsulated along its length with an insulating material to create an intermediate with an exposed insulating surface; creating parallel, spaced, elongated deposition channels through the insulating material to the underlying magnetic material layer, the deposition channels on opposite sides of and spaced from the winding; and overlaying the exposed insulating material and the exposed underlying magnetic material layer with magnetic material, to complete the magnetic core.

Also featured is a method of fabricating a planar inductive component having one or more conductive windings, a magnetic core co-linear with and surrounding all windings, and an insulator separating each winding from any other winding and from the magnetic core, the method comprising providing an intermediate comprising a conductive layer in contact with an insulating material layer overlaid with a layer of magnetic material defining a series of elongated, spaced gaps through to the insulating material layer; creating a series of parallel channels from the gaps, through the adjacent insulating material layer, to the adjacent winding layer; depositing magnetic material into the channels; removing portions of the winding layer aligned with the filled channels to leave an exposed surface comprising the one or more windings, each winding spaced from channels on either side of the winding; overlaying on the exposed surface an insulating material, leaving the magnetic material in the channels uncovered; and overlaying magnetic material on the insulating material on the exposed surface, and on the uncovered magnetic material in the channels, to complete the magnetic core.

Also featured in the invention is a method of fabricating a planar inductive component having one or more conductive windings, a magnetic core co-linear with and surrounding all windings, and an insulator separating each winding from any other winding and from the magnetic core, the method comprising providing a supportive substrate; defining an elongated channel in a surface of the substrate; lining the channel with an insulator; filling the lined channel with a conductor to create the winding; creating on at least part of the substrate surface over the winding, a layer of insulating material, to surround the winding with an insulator; creating parallel, elongated, spaced deposition channels through the insulating layer and spaced on either side of the winding, the channels extending into the substrate and completely under the winding, while providing spaced supports from the substrate to the insulator; and depositing completely surrounding the winding and its surrounding insulating layer, a layer of magnetic material, to form the magnetic core.

Featured as well is a method of fabricating a planar inductive component having one or more conductive windings, a magnetic core co-linear with and surrounding all windings, and an insulator separating each winding from any other winding and from the magnetic core, the method comprising providing an intermediate comprising the winding encapsulated along its length by an insulator; creating parallel, spaced, elongated deposition channels in the insulator on each side of and spaced from the winding; and depositing into the channels a magnetic material, to form at least part of the magnetic core.

BRIEF DESCRIPTION OF THE DRAWINGS

Other objects, features and advantages will occur to those skilled in the art from the following descriptions of the preferred embodiments, and the accompanying drawings, in which.

DESCRIPTION OF THE PREFERRED EMBODIMENTS OF THE INVENTION

This invention applies to the fabrication of planar inductive components for which the magnetic core encircles the conductor winding (or a number of independent conductor windings) along its (their) length, and an electrical insulator separates the conductor windings themselves, and separates the conductor windings from the magnetic core. The topology can be wire-like having a cross-section that is essentially uniform along the component length. The desired inductance is achieved by varying the length of the component. The conductor windings, the insulator structure and the magnetic core are collinear.

One-To-One Ratio Transformer

Figure 1:
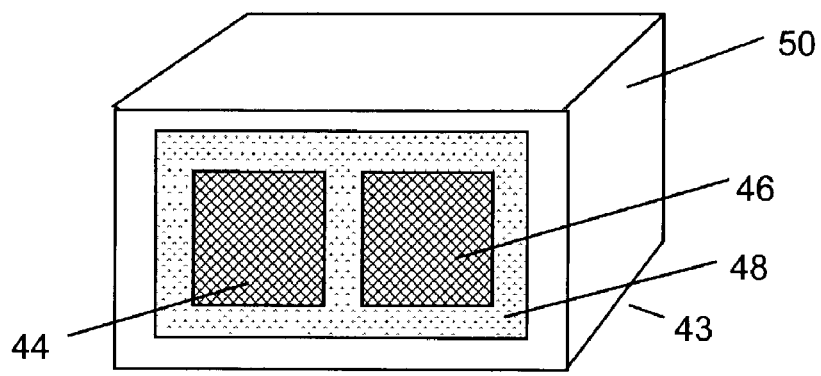
FIG. 1 is a schematic cross-sectional view of a one-to-one transformer having a unit length with two conductor windings.

A one-to-one ratio transformer 43 of unit length is shown in FIG. 1. It includes a single primary conductor winding 44 and a single secondary conductor winding 46. An electrical insulator 48 separates the conductor windings from each other and from the magnetic core. The magnetic core 50 encircles the insulator and conductor windings.

Inductor

Figure 2:
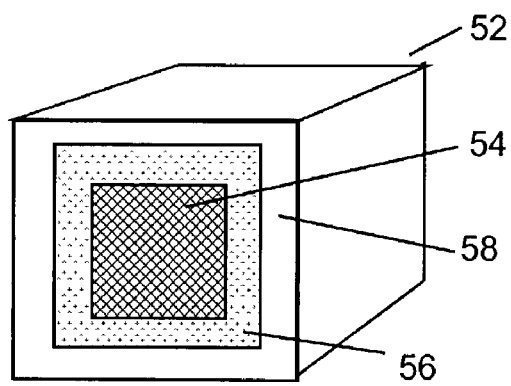
FIG. 2 is a schematic cross-sectional view of an inductor having a unit length.
Figure 3:
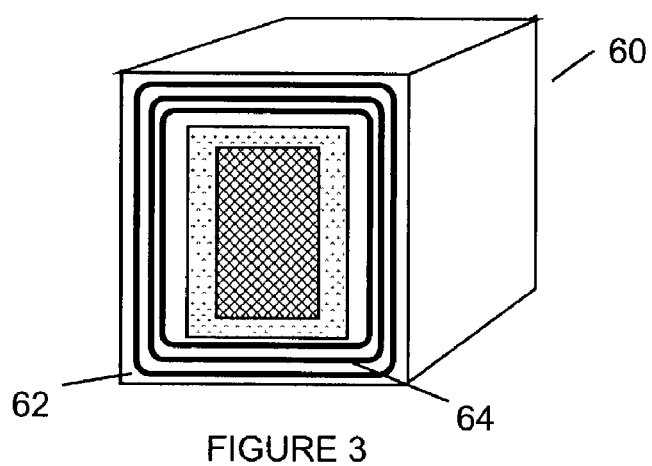
FIG. 3 is a schematic cross-sectional view of an inductor having a unit length, with magnetic laminations added to reduce eddy currents.

An inductor configuration 52 of unit length is shown in FIG. 2. It consists of a single conductor winding 54 enclosed by an insulator 56. Both the conductor winding and insulator are encircled by the magnetic core 58. FIG. 3 shows a magnetically laminated core 60 with 4 magnetic layers 62. The magnetic layers are separated by layers of material 64 that is non-magnetic and ideally non-conducting electrically.

Meandering Form

Figure 4:
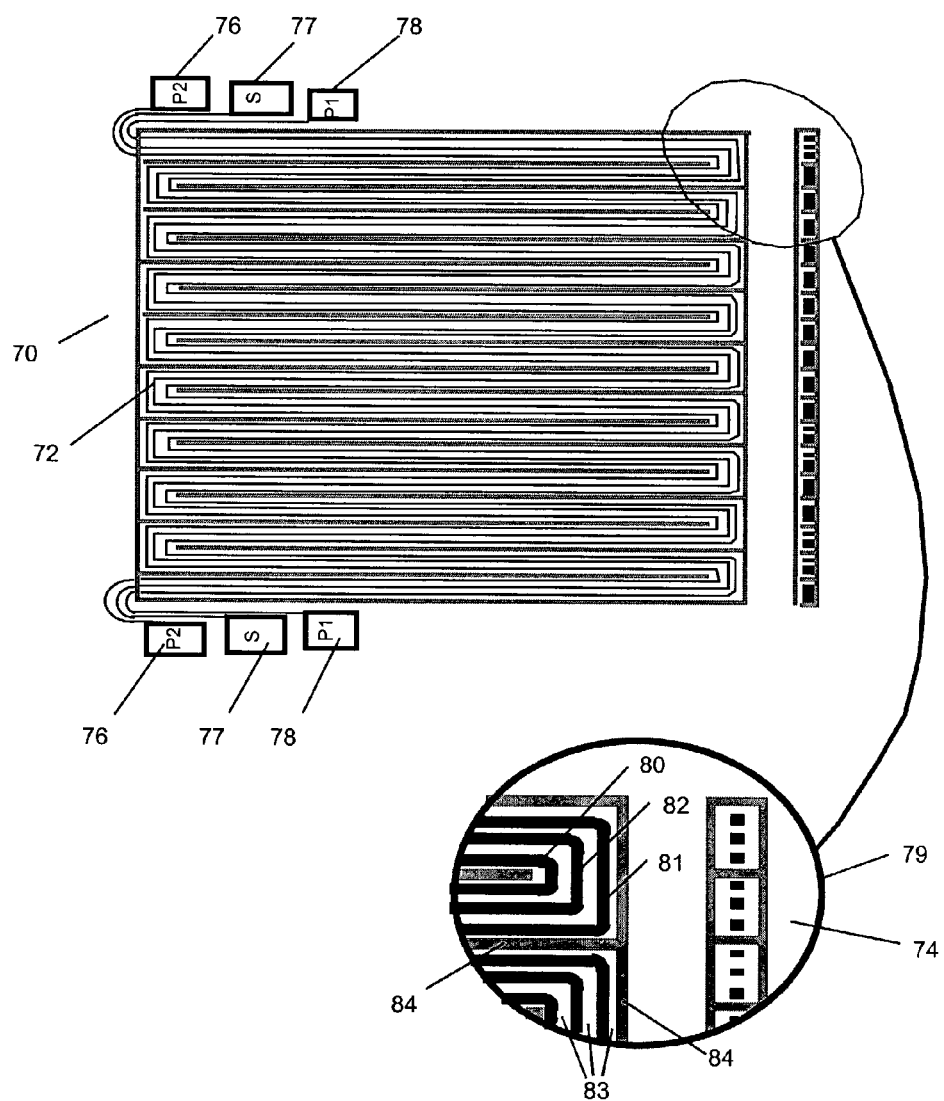
FIG. 4 is a schematic rendition of an inductor meandered to obtain the required length; the meander results in a planar rectangular arrangement for a differential current transformer.

To achieve the desired inductance, the inductive component must have the proper length. A top view of a DCT 70 (Differential Current Transformer, 3 conductors) is shown in FIG. 4 for a planar, rectangular component shape. The conductors and magnetic core are shown to meander 72 back and forth from side to side to achieve the necessary length. The thin cross-section 74 of the side-view is shown. The external connections to the DCT can be made at the pads 76, 77, and 78. In the meander detail shown in the enlarged view 79, are indicated a first primary 80, a second primary 81 and the secondary 82. The DCT is not limited to the rectangular shape shown, however, and can in fact meander along arbitrary paths and form any planar shape according to available space. An electrical insulator 83 separates the conductor windings from each other and the conductor windings from the magnetic core 84. Magnetic laminations are present but not shown.

General Fabrication Procedure

This invention relates to methods for fabricating planar inductors and transformers of which the inductor, the one-to-one transformer, the DCT and the inductor with laminations are examples. Other fabrication procedures that include different materials and fabrication technologies will occur to those skilled in the art. The devices are preferably symmetric about the winding(s). The described channels are parallel, and evenly spaced, to accomplish the symmetry.

Permalloy is one example of a magnetic core material that can be deposited by electrodeposition. SU-8, a negative photoresist, is one example of an electrical insulator material. SU-8 is attractive because it can be used to form electroplating molds that can be retained as part of the finished component. In these components the molds are also referred to as channels since they are long and narrow. Copper is an example of an electrically conductive material for forming windings.

Magnetic laminations are not shown in the fabrication procedures discussed. When laminations are necessary, the magnetic core is formed in multi-layers of magnetic material separated by thin non-magnetic, and preferably electrically non-conducting, layers.

The continuous magnetic circuit is completed in all cases by making certain that each segment of the magnetic core encircling the conductor winding makes a continuous magnetic contact with the next segment.

The deposition of materials can be accomplished by several technologies. Electroplating, vapor deposition and sputtering are three examples. Others will occur to those skilled in the art. Similarly, there are different methods for cutting into materials to form channels. Reactive Ion Etching is suitable for silicon. Other technologies such as chemical etching are possible. Different materials can be cut by different technologies and these will be apparent to those skilled in the different technologies.

Fabrication Approaches

1. Fabrication Within the Volume of a Silicon Wafer

This is an approach to embedding inductive components within the volume of a silicon wafer. Embedding enables:
  use of the silicon wafer volume,
  fabrication of Integrated Circuits (IC) next to inductive components,
  minimum device height over the silicon surface.

Embedding by this approach can also be accomplished into materials other than silicon by applying cutting technologies appropriate to the material. Deposition technologies and the use of the SU-8 can be common.

Figure 5:
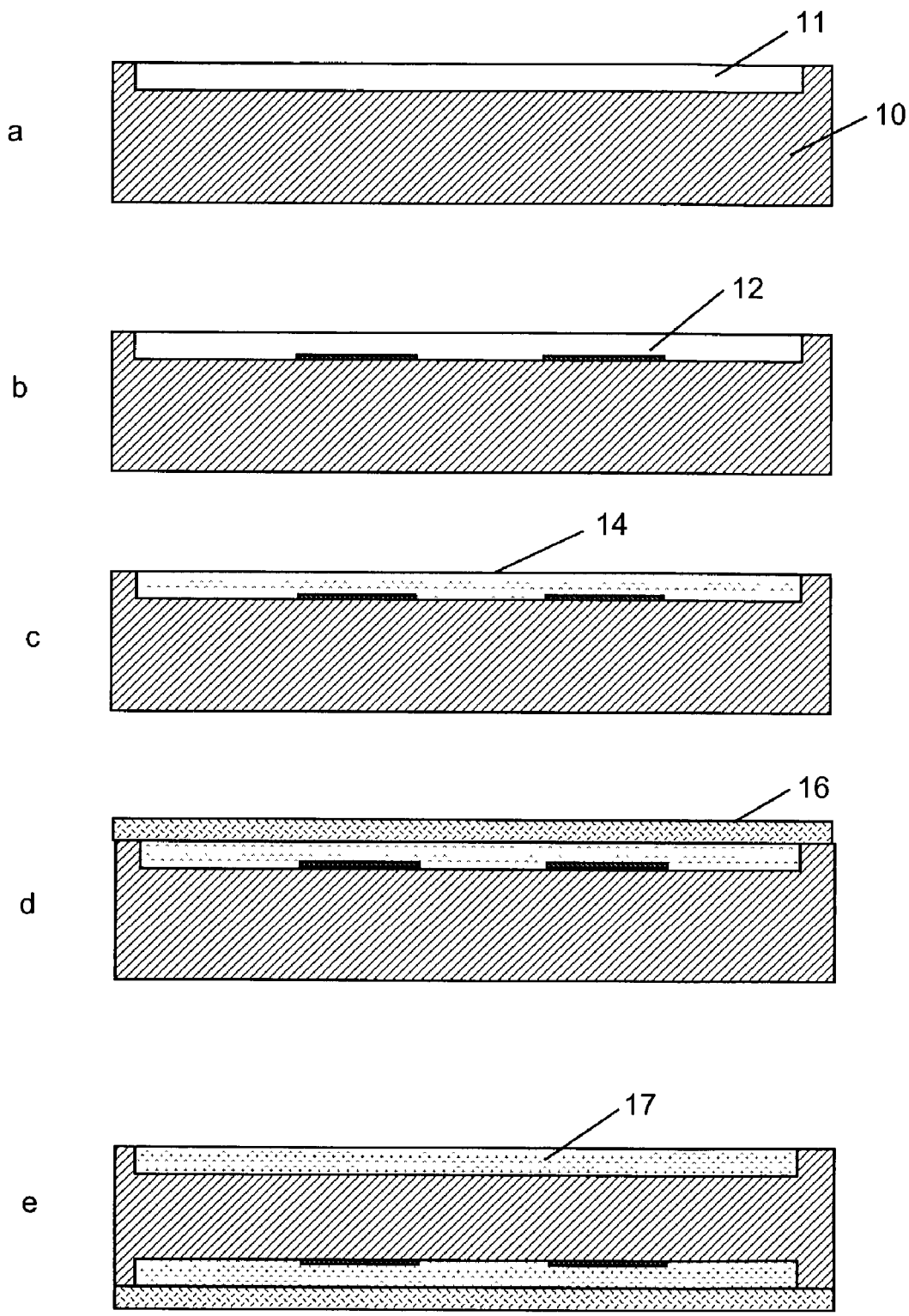
FIG. 5 depicts successive steps in a schematic process for the fabrication of an inductive component embedded within the volume of a silicon wafer; the inductive component has vertical magnetic core segments.
Figure 5:
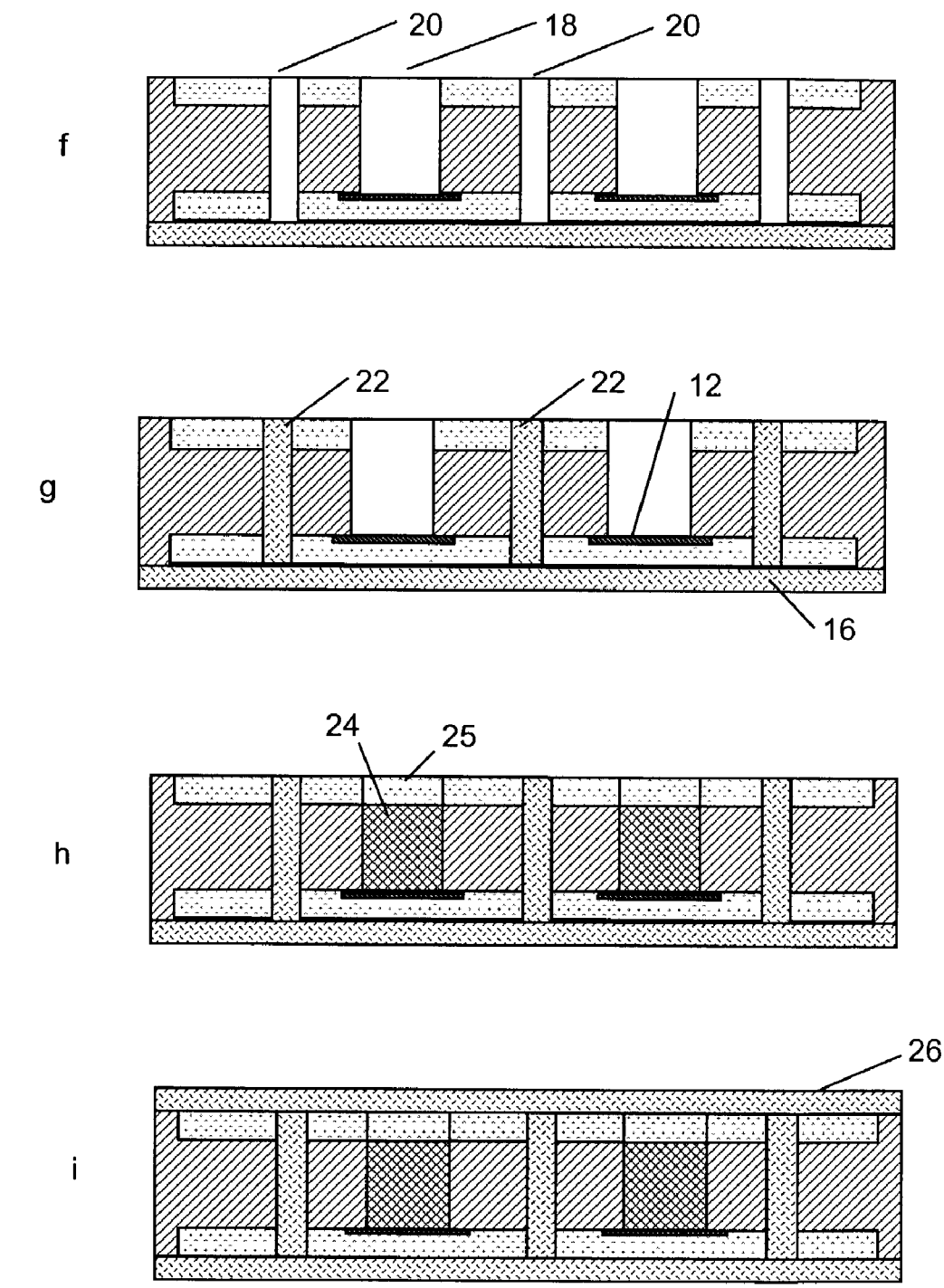

1a. Vertical Magnetic Core Segments (FIG. 5)

In this approach, vertical magnetic core segments are used to connect lower and top magnetic core segments to complete the magnetic circuit around the winding. The fabrication steps shown in FIG. 5 are as follows:

Step a: Start with the silicon wafer 10. Etch the silicon on the first surface of the wafer to create a channel well 11.

Step b: Pattern and metalize within the channel well to form conductor footings 12. Sputter deposition is a way to deposit the conductor footing material.

Step c: Fill the channel well with SU-8 photoresist to form a first SU-8 layer 14.

Step d: Deposit over the first wafer surface, by electroplating, a magnetic material such as Permalloy to form the first core segment 16 after a seed layer has been applied to the surface (the seed layer is not shown). This completes the first surface of the wafer. Sputter deposition and electroless deposition are ways to apply the seed layer.

Step e: On the second surface of the wafer, etch the silicon surface to create a channel well 17. Fill the channel well with SU-8 to form the second SU-8 layer.

Step f: Pattern and expose the SU-8 layer on the second surface of the wafer to form an SU-8 mask. Etch the uncovered silicon down to the conductor footing to form conductor winding channels 18 and down to the first SU-8 layer to form magnetic core channels 20. The part of the first SU-8 layer at the bottom of the magnetic core channel is then removed to expose the first magnetic core segment. Etching of the silicon is accomplished by Reactive Ion Etching (RIE). Oxidize the silicon channel walls to form an electrically-insulating oxide for electrical isolation (oxide not shown).

Step g: Connect electrically to the first magnetic core segment 16 on the first wafer surface and electroplate Permalloy to fill the magnetic core channel up to the top surface of the second SU-8 layer on the second wafer surface to form vertical magnetic core segments 22.

Step h: Connect electrically to the conductor footing 12 and electroplate copper to fill the conductor channel to the top of the silicon surface as shown to form a conductor winding 24. Complete the fill of the conductor channel 25 with SU-8 to the top surface of the second SU-8 layer on the second wafer surface. Planarize the second surface to expose the vertical magnetic core segment.

Step i: Deposit the magnetic core segment 26 on the second wafer surface after a seed layer has been applied over the surface. This completes the core.

Figure 6:
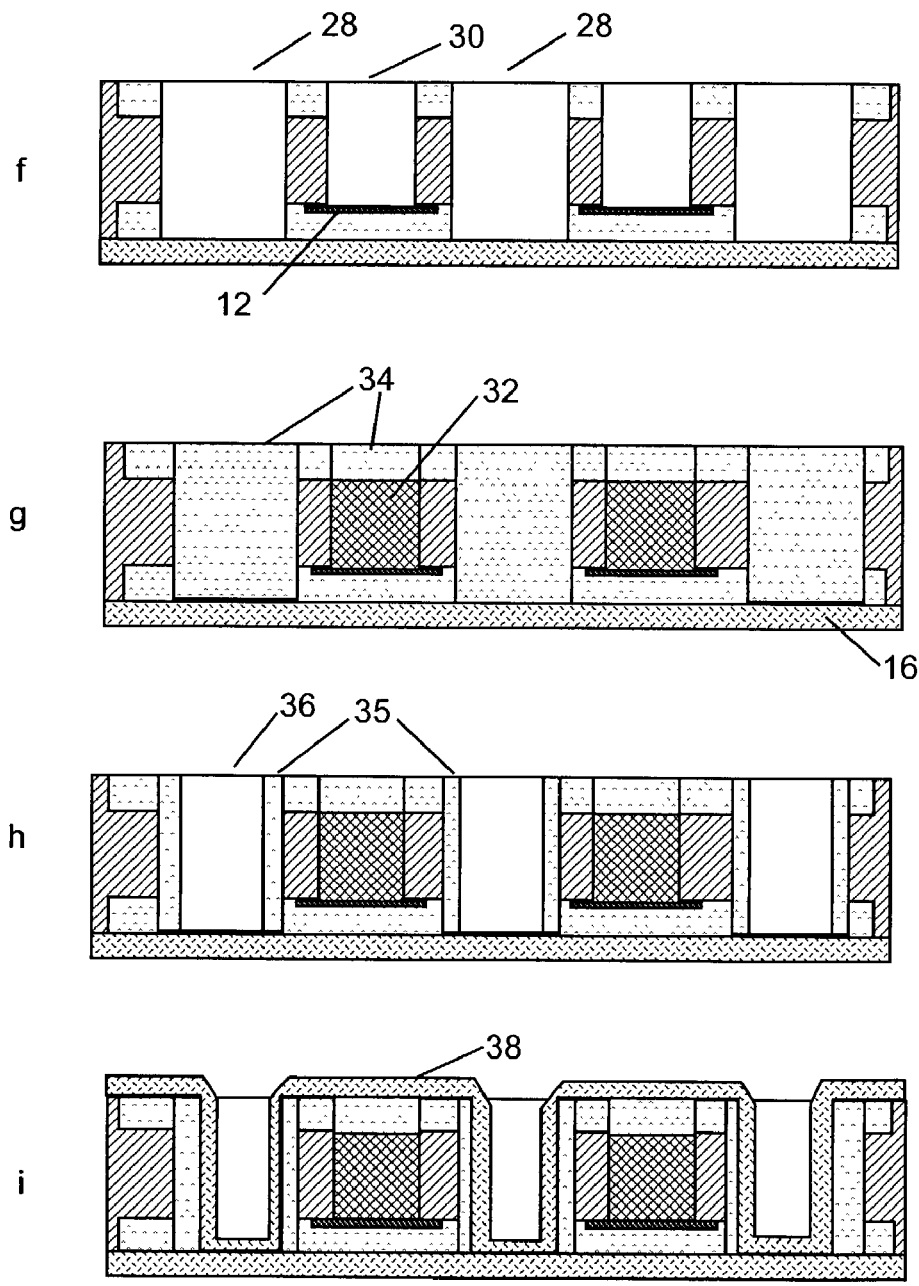
FIG. 6 depicts successive steps in a schematic process for the fabrication of an inductive component embedded within the volume of a silicon wafer; the inductive component has conformally-formed magnetic core segments.

1b. Conformal Formation of Magnetic Core Segments (FIG. 6)

In this approach, magnetic core segments are formed by the conformal deposition of magnetic material about non-planar structures. This is a practical approach to the formation of magnetic laminations that requires the alternate deposition of magnetic and non-magnetic layers. In the ideal case, conformal deposition forms one continuous magnetic structure (circuit) about the winding followed by a continuous non-magnetic layer and so on. The fabrication steps shown in FIG. 6 are as follows:

Steps a–e: Same as Fabrication 1a.

Step f: Pattern and expose the SU-8 layer on the second surface of the wafer to form an SU-8 mask. Etch the uncovered silicon down to the conductor footing to form conductor winding channels 30 and down to the first SU-8 layer to form wider magnetic core channels 28. The part of the first SU-8 layer at the bottom of the magnetic core channel is then removed to expose the first magnetic core segment. Etching of the silicon is accomplished by Reactive Ion Etching (RIE). Oxidize the silicon channel walls to form an oxide for electrical isolation (oxide not shown).

Step g: Connect electrically to the conductor footing 12 and electroplate copper to fill the conductor channel to the top of the second silicon surface, as shown, to form conductor winding 32. Fill with SU-8 34 the wide magnetic channel and complete the fill of the conductor channel up to the top surface of the second SU-8 layer. Planarize if necessary.

Step h: Pattern and expose the SU-8 located above the wide channels. Within the wide channels, the exposed SU-8 forms vertical insulation sidewalls 35. The unexposed SU-8 is removed to form the narrower channel down to the lower magnetic core.

Step i: Apply a seed layer conformally over all surfaces (seed layer is not shown) including surfaces of the narrower channel. Connect electrically to the first magnetic core segment and electroplate magnetic material over all surfaces to form the conformal core segment 38.

Figure 7:
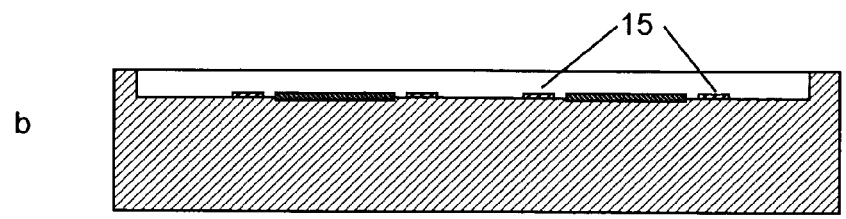
FIG. 7 depicts successive steps in a schematic process for the fabrication of an inductive component embedded within the volume of a silicon wafer; the inductive component has vertical magnetic core segments and insulation wall structures.
Figure 7:
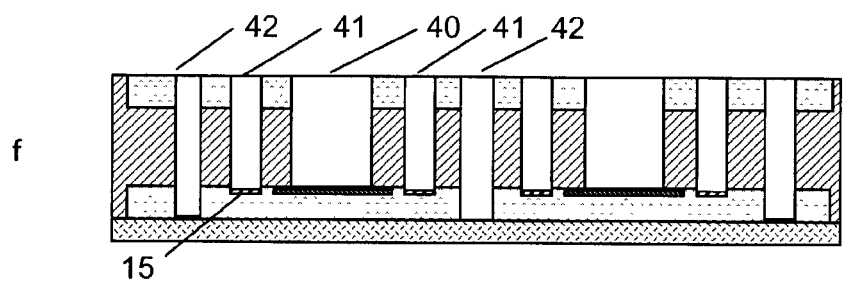
Figure 7:
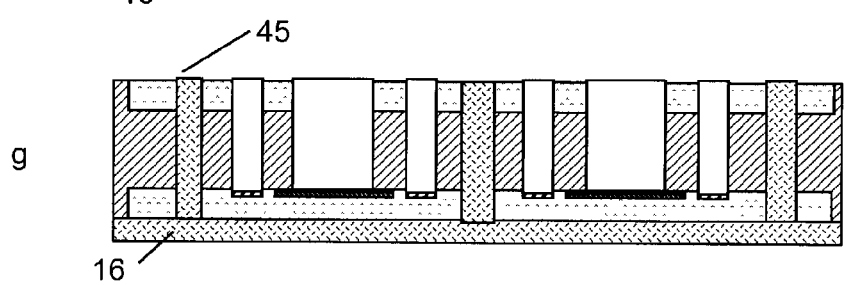
Figure 7:
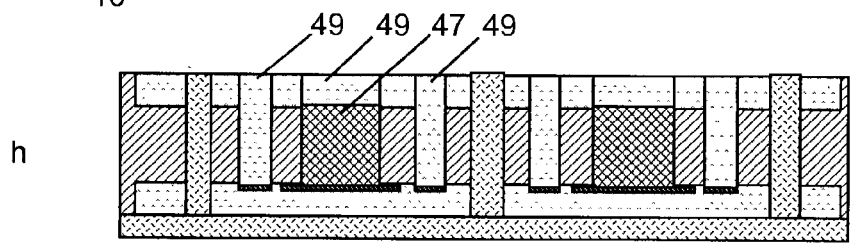
Figure 7:
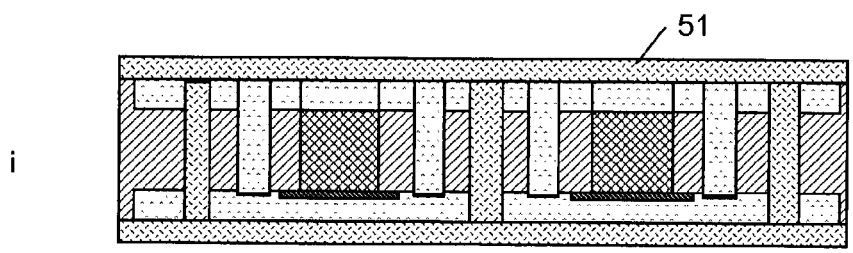

1c. Extra Insulation (FIG. 7)

The inductive component resulting from Fabrication Process 1a can be improved by providing insulation sidewalls between the silicon and the vertical magnetic core segments, in addition to oxide. The fabrication steps shown in FIG. 7 are as follows:

Step a: Same as in Fabrication 1a.

Step b: Same as in Fabrication 1a, with added electrical insulation footings 15 located on both sides of the conductor footings. The insulation footing prevents the exposure of the magnetic segment and the filling of insulation channels during the electroplating of the vertical magnetic segments in a later step.

Steps c–e: Same as in Fabrication 1a.

Step f: Pattern and expose the SU-8 layer on the second surface of the insulation footing wafer to form an SU-8 mask. Etch the uncovered silicon down to the conductor footing to form conductor winding channels 40, down to the insulation footing to form the insulation channels 41 and down to the first SU-8 layer to form the magnetic core channels 42. The part of the first SU-8 layer at the bottom of the magnetic channel is removed to expose the first magnetic core. The insulation footing material needs to be resistant to the method used to remove the SU-8. Oxidize the channel walls to provide electrical insulation from the silicon material.

Step g: Connect electrically to the first magnetic core segment 16 on the first wafer surface and electroplate Permalloy to fill the magnetic core channels up to the top surface of the second SU-8 layer on the second wafer surface to form vertical magnetic core segments 45.

Step h: Connect electrically to the conductor footing 12 and electroplate copper to fill the conductor channel to the top of the silicon surface as shown to form a conductor winding 47. Fill with SU-8 49 the insulation channel and complete the fill of the conductor channel up to the top surface of the second SU-8 layer. Planarize to expose the vertical magnetic core segment.

Step i: Deposit the magnetic core segment 51 on the second wafer surface after a seed layer has been applied over the surface.

2. Fabrication onto Substrates

In this approach, layers are deposited onto a substrate prior to cutting and filling.

2a. Vertical Magnetic Segments (FIG. 8)

Figure 8:
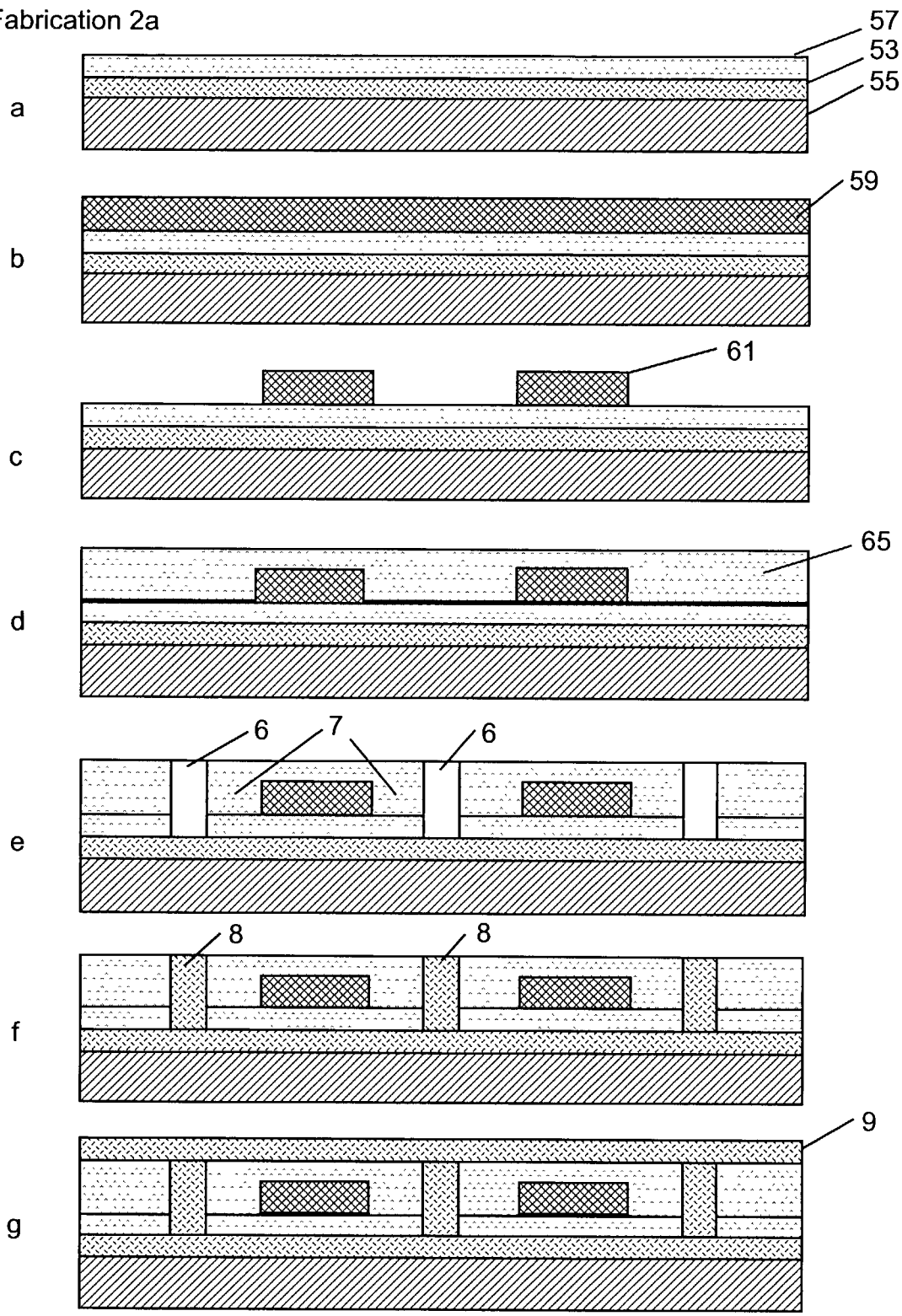
FIG. 8 depicts successive steps in a schematic process for the fabrication of an inductive component onto the surface of a substrate; the inductive component has vertical magnetic core segments.

The fabrication steps shown in FIG. 8 are as follows:

Step a: Deposit a magnetic material layer 53 onto a substrate 55 that is non magnetic and ideally non-conducting electrically. An electrical insulator layer (not shown) can be deposited onto the conductive substrate prior to the first step if necessary. Deposit an electrical insulator layer 57 over the magnetic layer. SU-8 is an example of an electrical insulator material that can be used that also serves as a photoresist.

Step b: Deposit an electrical conductor material 59 onto the SU-8 layer. Copper is an example of an electrical conductor material.

Step c: Pattern the copper layer and etch to form a conductor winding 61.

Step d: Apply a top SU-8 layer 65 sufficiently thick so as to be planar and encapsulate the conductor windings.

Step e: Pattern and expose the SU-8. The unexposed regions are etched down to the lower magnetic layer to form vertical magnetic channels 6. The exposed regions form the electrical insulation structure 7 that surrounds the conductor windings and remains part of the inductive component.

Step f: Electrically connect to the lower magnetic layer and electroplate Permalloy into the magnetic channels up to the top surface of the SU-8 to form vertical magnetic segments 8. Planarize if necessary.

Step g: Apply a seed layer over the top surface. Electrically connect to the lower magnetic layer and electroplate with Permalloy to form the top magnetic layer 9.

2b. Conformal Deposition of Magnetic Material (FIG. 9)

Figure 9:
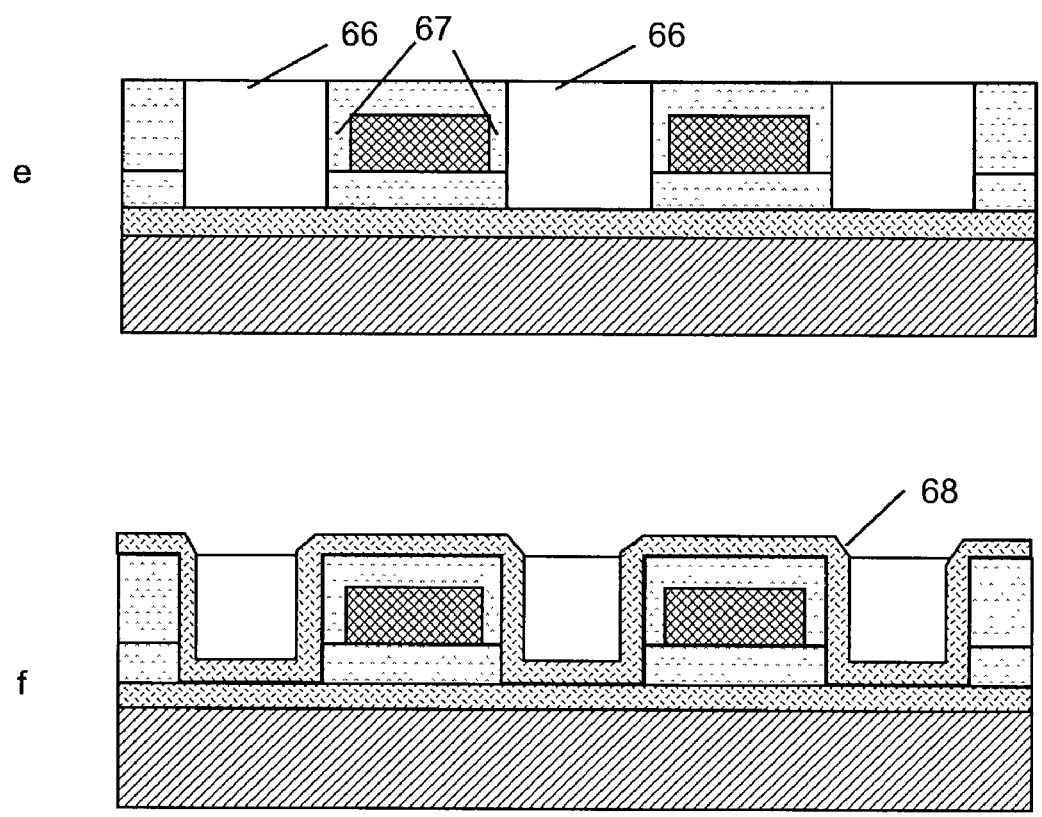
FIG. 9 depicts successive steps in a schematic process for the fabrication of an inductive component onto the surface of a substrate; the inductive component has conformally-formed magnetic core segments.

The fabrication steps shown in FIG. 9 are as follows:

Steps a–d: Same as Fabrication 2a.

Step e: Pattern with wider channels and expose the SU-8 layer. The unexposed regions are etched down to the lower magnetic layer to form vertical magnetic channels 66. The exposed regions form the electrical insulation structure 67 that surrounds the conductor windings and remains part of the inductive component.

Step f: Electrically connect to the lower magnetic layer and electroplate Permalloy conformally over all surfaces after a seed layer is applied to form the conformal magnetic segment 68.

3. Fabrication by Layering of Prefabricated Sheet Stock as a First Step

This approach is a means to achieve construction of inductive components by starting with a stack of layers of different materials, etching channels into the stack and filling the channels by electroplating or other means. One starting stack comprises five layers having different material properties as listed from the bottom: magnetic, electrical insulator, conductor, electrical insulator and magnetic. Other stacks are possible. The stacks can be pre-made by lamination of sheet stock of the proper materials, or can be fabricated by sequential deposition of the materials.

The main advantages to this approach are:
a. the stack starts with materials of known thickness and properties,
b. the vertical magnetic channels are filled with one, continuous electrodeposition step.

3a. Vertical Magnetic Segments (FIG. 10)

Figure 10:
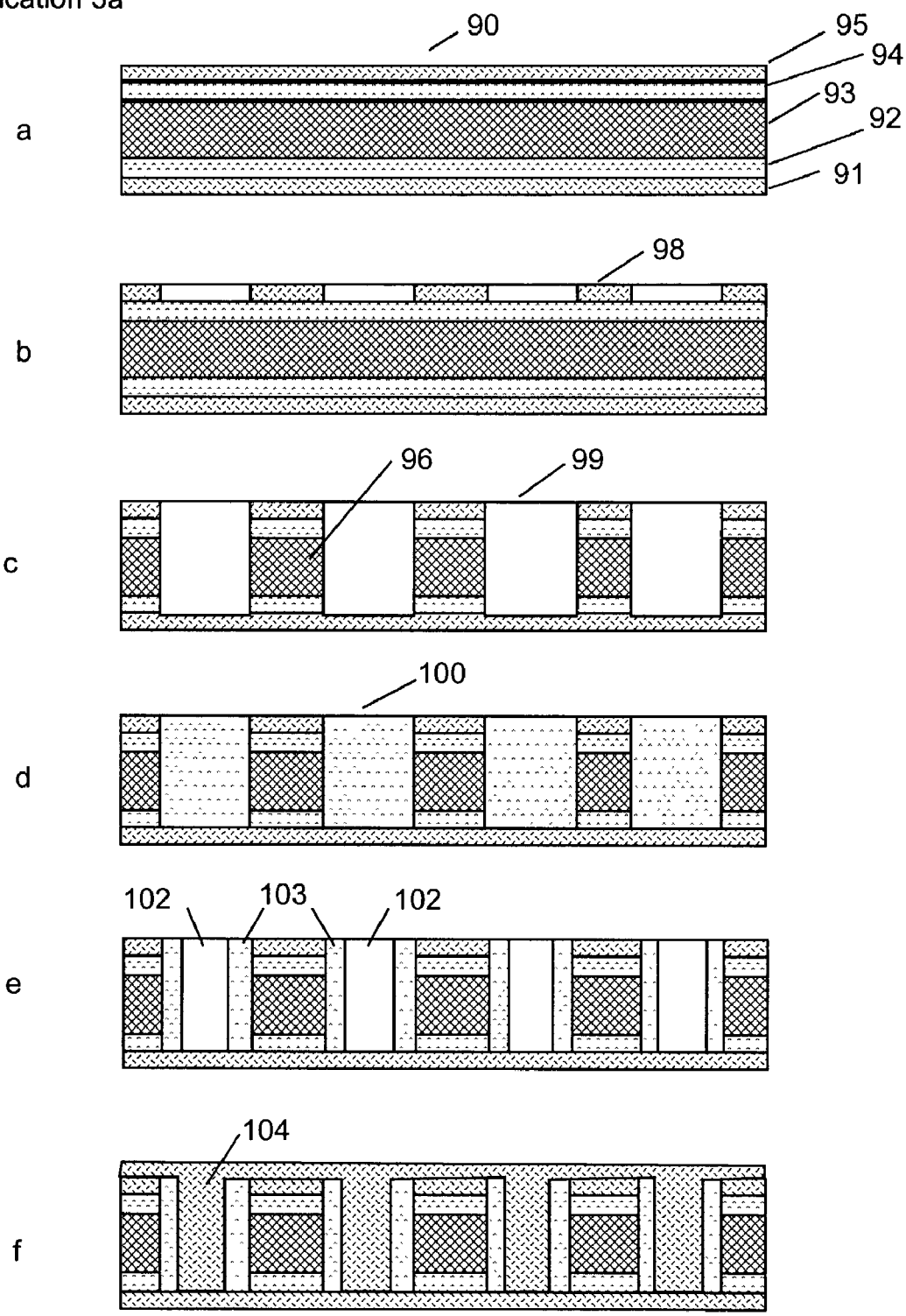
FIG. 10 depicts successive steps in a schematic process for the fabrication of an inductive component with vertical magnetic core segments by starting with a laminated stack of magnetic, electrically insulating and electrically conductive layers.

The fabrication steps shown in FIG. 10 are as follows:

Step a: The starting material is a stack of five layers 90 that are bonded together. The layers are preferably prefabricated as sheet stock. They include a magnetic material 91, an electrical insulator 92, an electrical conductor 93, an electrical insulator 94 and a magnetic material 95.

Step b: Pattern and chemically etch the top magnetic layer to form a metallic mask 98.

Step c: Using the magnetic layer as a mask, remove material vertically down to the bottom magnetic layer to form channels 99. The conductive winding 96 is formed as part of this step.

Step d: Fill the channels with SU-8 photoresist 100.

Step e: Pattern and expose the SU-8. The exposed region of the SU-8 forms vertical insulator wall structures 103 on either side of the conductor. The unexposed SU-8 is removed down to the lower magnetic layer to form narrower vertical magnetic channels 102.

Step f: Apply the seed layer to the top surface. Connect electrically to the lower magnetic layer and electroplate within the channel to form the vertical magnetic segment 104 followed by the electroplating of the top surface by additionally connecting electrically to the top magnetic layer 3b. Conformal Deposition of Magnetic Material (FIG. 11)

Figure 11:
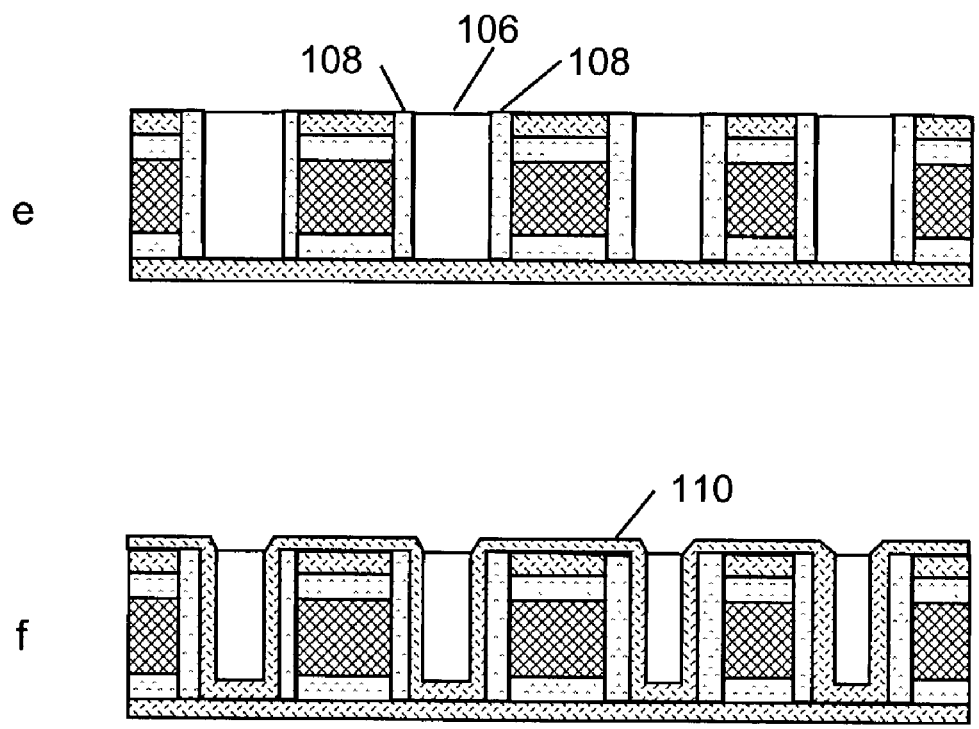
FIG. 11 depicts successive steps in a schematic process for the fabrication of an inductive component with conformally-formed magnetic core segments by starting with a laminated stack of magnetic, electrically insulating and electrically conductive layers.

The fabrication steps shown in FIG. 11 are as follows:

Steps a–d: Same as Fabrication 3a steps.

Step e: Pattern and expose the SU-8 for a wider channel 106. The exposed region forms vertical insulation wall structures 108. The unexposed region is etched down to the lower magnetic layer.

Step f: Apply a seed layer conformally over all surfaces. Connect electrically to the lower magnetic material and deposit magnetic material 110 by electroplating conformally over all surfaces.

3c: Starting Layer Stack is Formed by Sequential Deposition

Sputtering and electrodeposition are two ways to deposit layers. The five materials are deposited sequentially one on top of the other to form the starting stack. Fabrications 3a and 3b can be followed. Advantages to this approach are that bonding is not necessary and thinner layers can be used.

4. Starting Material is a Printed Circuit Embedded in Insulation Cladding

Two approaches are possible: vertical walls and conformal. The advantage to this approach is that the copper patterning with insulation can be prefabricated. The fabrication procedure is as follows:

4a. Vertical Magnetic Segments (FIG. 12)

Figure 12:
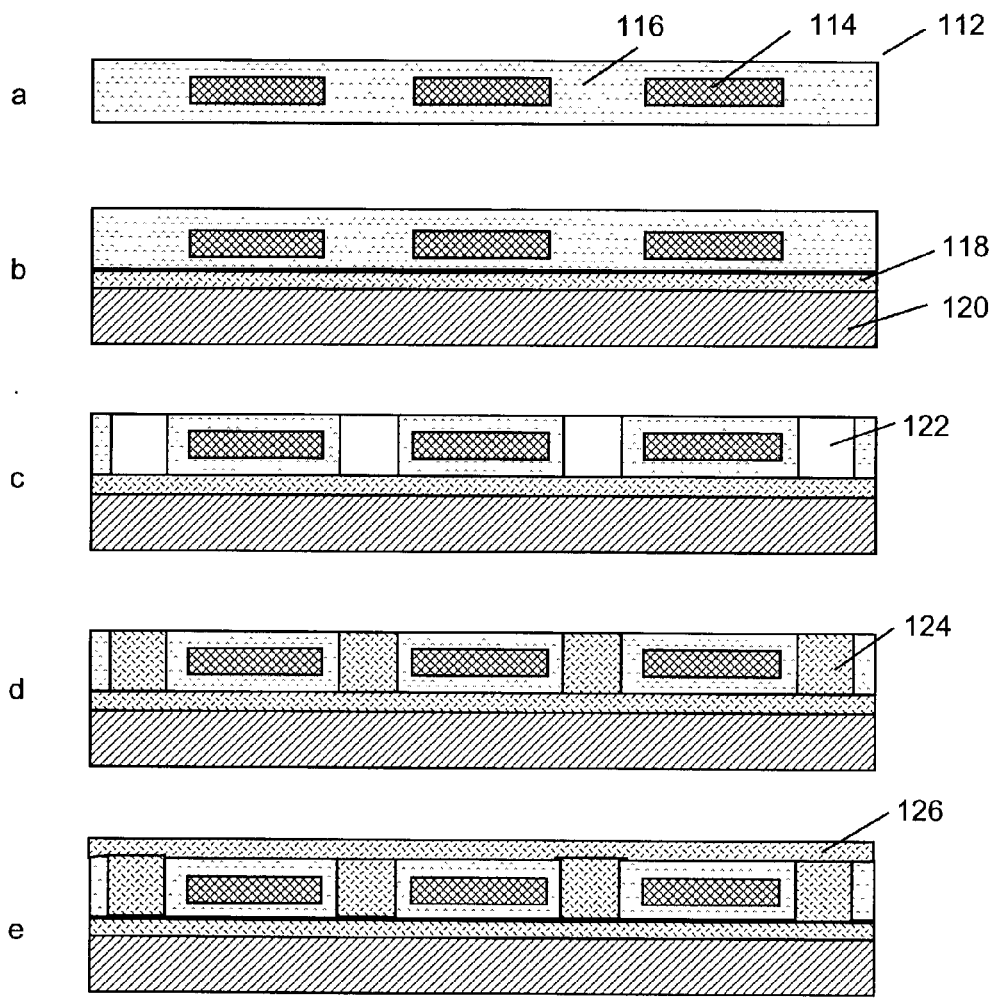
FIG. 12 depicts successive steps in a schematic process for the fabrication of an inductive component with vertical magnetic core segments by starting with a printed circuit embedded in electrically insulating cladding.

The fabrication steps shown in FIG. 12 are as follows:

Step a: The starting material 112 is a copper circuit 114 embedded within an electrical insulator cladding 116.

Step b: A magnetic layer 118 is separately applied to a substrate 120. The layer can be pre-formed or deposited. The starting material 112 is then bonded to the magnetic layer on the substrate. Note that steps a and b could also be accomplished by sequential deposition.

Step c: The electrical insulator material between the copper is patterned and etched to form channels 122 down to the magnetic layer.

Step d: Connect electrically to the magnetic layer and electroplate to fill within the channel to form vertical magnetic segments 124.

Step e: Apply a seed layer over the top surface. Connect electrically to the magnetic layer and electroplate over the top surface to form the top magnetic layer 126.

4b. Conformal Deposition of Magnetic Material (FIG. 13)

Figure 13:
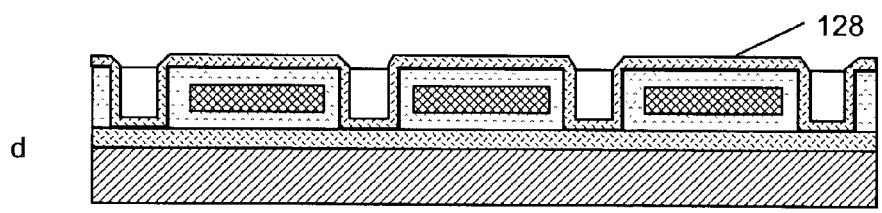
FIG. 13 depicts successive steps in a schematic process for the fabrication of an inductive component with conformally-formed magnetic core segments by starting with a printed circuit embedded in electrically insulating cladding.

The fabrication steps shown in FIG. 13 are as follows:

Steps a–c: Same as Fabrication 4a.

Step d: Apply a seed layer conformally over all surfaces. Connect electrically to the lower magnetic layer and electroplate to form the conformal magnetic layer 128.

5. Fabrication with Kapton and Copper.

In this procedure Kapton is selected because it is an electrical insulator, can be matched to the thermal expansion coefficient of copper and can be chemically etched. A laser can also be used to cut the Kapton.

5a. Vertical Magnetic Walls (FIG. 14)

Figure 14:
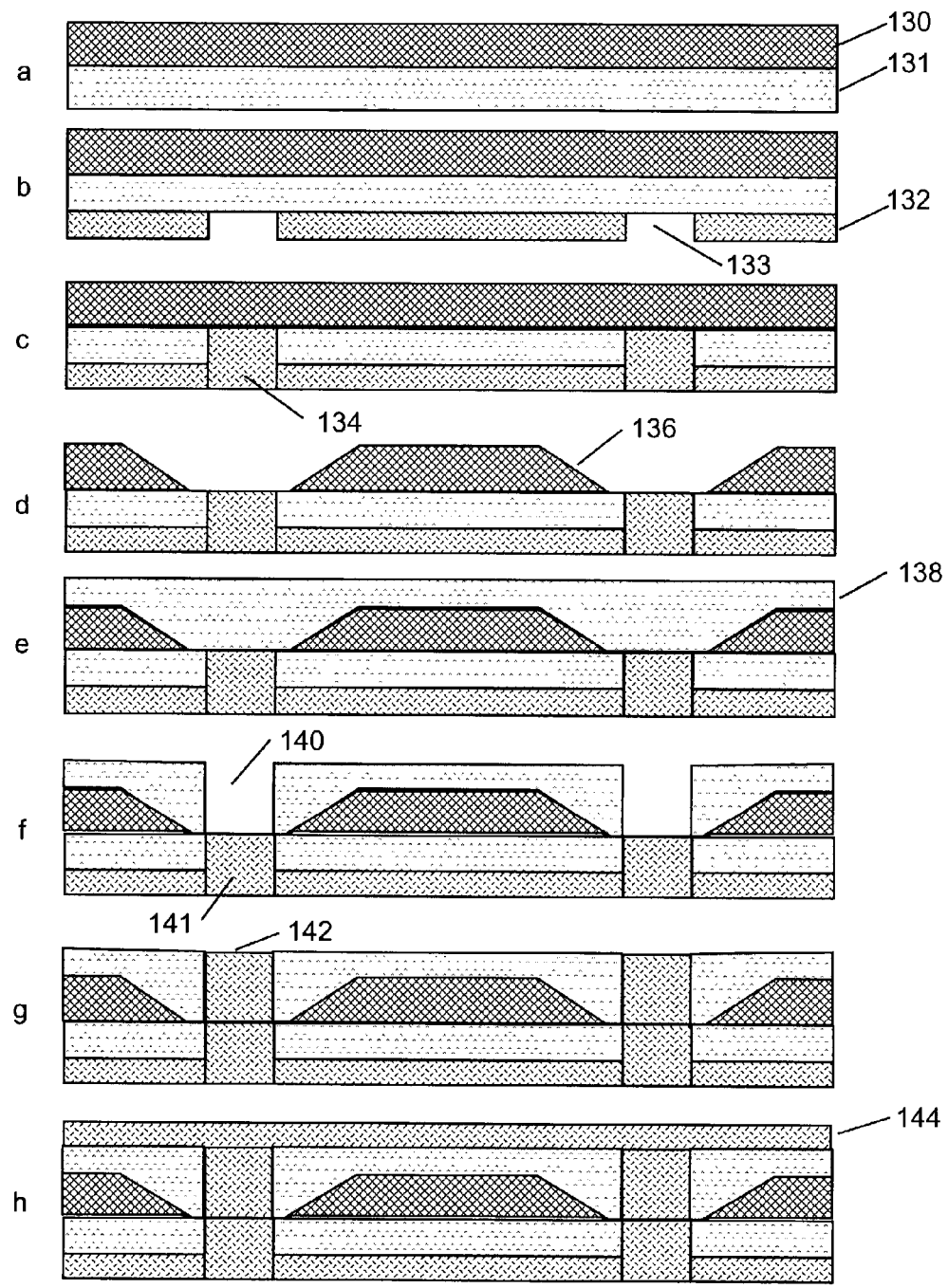
FIG. 14 depicts successive steps in a schematic process for the fabrication of an inductive component with vertical magnetic core segments and conductor windings with a trapezoidal cross section.

The fabrication steps shown in FIG. 14 are as follows:

Step a: A copper conductor layer 130 is applied to a Kapton electrically insulating substrate 131. Copper in sheet stock can be bonded to Kapton or copper can be deposited onto the Kapton.

Step b: A magnetic layer 132 such as Permalloy is applied to the second side of the Kapton (shown from below). Permalloy can be applied in sheet form and bonded, or it can be deposited after a seed layer is applied. In this case, the magnetic lower layer is patterned and etched to form a channel 133.

Step c: Using the channel in the magnetic lower layer, the Kapton is etched to extend the channel depth to the conductor layer. The channel is then electroplated to filling with magnetic material to form a vertical magnetic segment 134 after a seed layer is applied and an electrical connection made to the conductor layer.

Step d: Using resist and patterning, a chemical etch is used to form the trapezoidal copper winding 136.

Step e: An electrical insulator such as SU-8 138 is allowed to flow and become planar to cover the copper winding.

Step f: A vertical channel 140 is patterned and etched in the SU-8. The channel is located above the magnetic posts 141 from below.

Step g: After electrical connection is made to the magnetic layer, the channels are plated to complete the upper portion of the vertical magnetic segment 142.

Step h: A seed layer is applied to the top surface. After electrically connecting to the magnetic layer, magnetic material is electroplated over the top surface to form the top magnetic layer 144.

5b. Conformal Application of Magnetic Material (FIG. 15)

Figure 15:
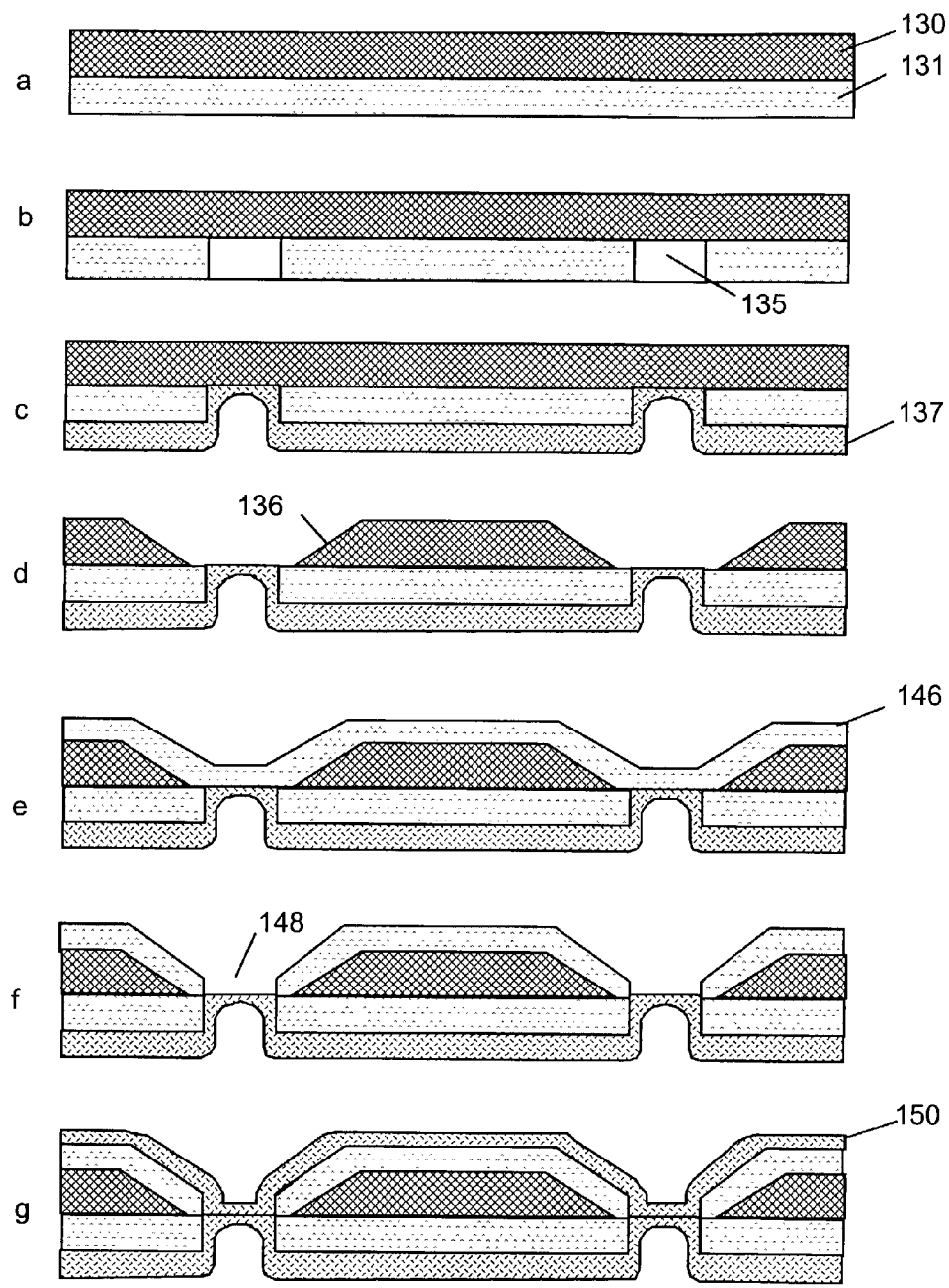
FIG. 15 depicts successive steps in a schematic process for the fabrication of an inductive component with conformally-formed magnetic core segments and conductor windings with a trapezoidal cross section.

The fabrication steps shown in FIG. 15 are as follows:

Step a: A copper conductor layer 130 is applied to a Kapton electrically insulating substrate 131. Copper in sheet stock can be bonded to Kapton or copper can be deposited onto the Kapton.

Step b: The Kapton is patterned and etched to form channels 135.

Step c: After a seed layer is applied to the Kapton surface, a magnetic material is electroplated conformally over the Kapton surface and channel walls to form the lower magnetic layer 137.

Step d: Using resist and patterning, a chemical etch is used to form the trapezoidal copper winding 136.

Step e: A conformal electrical insulator 146 is applied to the top surface.

Step f: The portion 148 of the conformal insulator above the magnetic vertical channel is removed. A laser is one means to accomplish this.

Step g: A seed layer is applied to the top surface. An electrical connection is made to the lower magnetic layer and the top surface is electroplated conformally to form the top magnetic layer 150.

Figure 16:
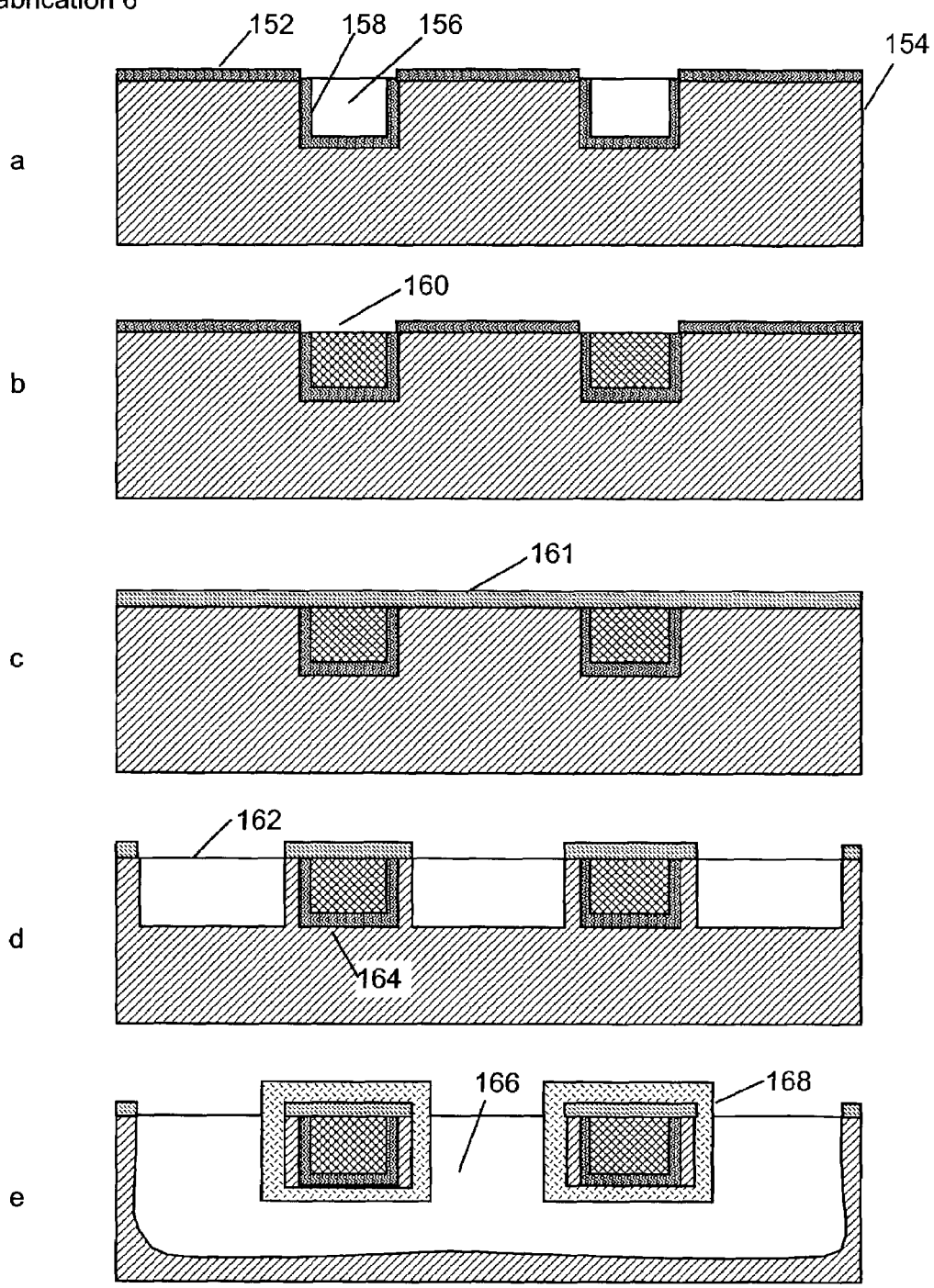
FIG. 16 depicts successive steps in a schematic process for the fabrication of an inductive component by etching into one surface of the silicon wafer to form channel wells, filling the channel wells to form windings, undercutting the channel wells and coating all around with insulation and magnetic materials; one surrounding layer of the magnetic core is shown.

6. Fabrication on One Side of a Silicon Wafer (FIG. 16)

This approach allows for the formation of the inductive component on one side of the silicon wafer while keeping the other side untouched. The other side can then be fully used for IC fabrication. The IC and component can then be connected through vias in the silicon. The fabrication steps shown in FIG. 16 are as follows:

Step a: Form an oxide layer 152 on the surface of the wafer 154. Then pattern and etch the oxide to form a mask. Etch into the silicon using the oxide mask to form conductor channels 156. Etching into the silicon can be accomplished using Deep Reactive Ion Etching (DRIE). Form an oxide coating 158 on the channel walls to provide electrical isolation.

Step b: Apply a seed layer to the conductor channel and electroplate copper into the channel to form a conductor winding 160. Remove oxide from the silicon surface.

Step c: Apply a photoresist 161 to the top layer that can be left in place to form an insulation layer above the conductor.

Step d: Pattern the resist and etch silicon channels 162 on both sides of the conductor to a depth below the conductor channel.

Step e: Apply an undercutting etch to deepen the channels and etch beneath the conductor channels to form a large well 166. Xenon Difluoride is one etching system that can be used. The winding is suspended from the silicon through oxide and silicon infrastructure that is not removed (not shown). A seed layer is applied all around the winding. After electrical connection, to the seed layer, the magnetic material layer 168 is electroplated all around the winding.

Other embodiments will occur to those skilled in the art, and are within the scope of the following claims.

What is claimed is:

1. A method of fabricating a planar inductive component having one or more conductive windings, a magnetic core co-linear with and surrounding all windings, and an insula tor separating each winding from any other winding and from the magnetic core, the method comprising:

providing a component support member defining a non-magnetic top surface;

sequentially overlaying at least part of the top surface of the support member with a first layer of magnetic material, a first layer of insulating material, and a layer of conductive material;

removing portions of the conductive material layer down to the underlying insulating material to leave the inductive component winding;

overlaying the exposed first layer of insulating material and the winding with a second layer of insulating material;

creating spaced, elongated, parallel deposition channels through both layers of insulating material to the underlying first layer of magnetic material, the deposition channels on opposite sides of and spaced from the winding; and overlaying the exposed insulating material and the exposed first layer of magnetic material with magnetic material, to complete the magnetic core.

2. The method of claim 1 wherein the magnetic material overlaying step comprises depositing a seed conductive layer before overlaying the magnetic material, to allow electrodeposition of the magnetic material.

3. The method of claim 1 wherein overlaying with magnetic material comprises filling the deposition channels with magnetic material.

4. The method of claim 1 wherein overlaying with magnetic material comprises conformal coating.

5. The method of claim 4 wherein the conformal coating comprises a series of thin magnetic laminations separated by non-magnetic layers.

6. The method of claim 5 wherein the thin non-magnetic layers are also non-conductive.

* * * * *